United States Patent
Schmidt, Jr. et al.

[11] Patent Number: 6,015,300
[45] Date of Patent: *Jan. 18, 2000

[54] ELECTRONIC INTERCONNECTION METHOD AND APPARATUS FOR MINIMIZING PROPAGATION DELAYS

[75] Inventors: Raymond J. Schmidt, Jr., Stoughton; Mahesh N. Ganmukhi, Carlisle; Patrick L. DeAngelis, Northborough, all of Mass.

[73] Assignee: Ascend Communications, Inc., Westford, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/919,825

[22] Filed: Aug. 28, 1997

[51] Int. Cl.$^7$ .................................................. H01R 9/09
[52] U.S. Cl. .............................................. 439/61; 361/788
[58] Field of Search ........................ 439/61, 65; 361/788, 361/796

[56] References Cited

U.S. PATENT DOCUMENTS

| | | | |
|---|---|---|---|
| 5,289,340 | 2/1994 | Yoshifuji | 439/61 |
| 5,335,146 | 8/1994 | Stucke | 439/796 |
| 5,352,123 | 10/1994 | Sample et al. | 439/61 |
| 5,583,867 | 12/1996 | Poole | 439/61 |

*Primary Examiner*—Steven L. Stephan
*Assistant Examiner*—T. C. Patel
*Attorney, Agent, or Firm*—Weingarten, Schurgin, Gagnebin & Hayes LLP

[57] ABSTRACT

A module interconnection system which minimizes electronic signal propagation delays is disclosed. The module interconnection system includes a backplane, a first plurality of connectors arranged in a side by side generally parallel arrangement, and a second plurality of connectors arranged in a side by side generally parallel arrangement. In a preferred embodiment, the second plurality of connectors are mounted on the backplane at right angles to the first plurality of connectors so as provide short routing paths between each of the second plurality of connectors and at least one of the first plurality of connectors. Point-to-point signal interconnections are selectively utilized to provide data paths between selected contacts of at least one of the first plurality of connectors and selected contacts of the second plurality of connectors. The above described interconnection apparatus permits high speed data communication between modules disposed in at least one of said first plurality of connectors and at least one module disposed in said second plurality of connectors.

14 Claims, 4 Drawing Sheets

6,015,300

ELECTRONIC INTERCONNECTION METHOD AND APPARATUS FOR MINIMIZING PROPAGATION DELAYS

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

In an electronic system such as a computer network switch, a backplane is used to provide interconnection between modules of the system. The backplane provides for power distribution and data transport among modules in the system. The backplane includes rows of connectors, which define physical slots, into which the modules are inserted. The modules include at least one connector or a set of electrical contacts along an edge of the module which mate with a corresponding connector on the backplane when the module is inserted into the respective connector on the backplane. The backplane contains signal paths, typically in the form of printed circuit lines for interconnecting the connectors to each other, usually as a bus in which a signal path connects a contact in each connector across the backplane. In a system in which a majority of the signals are bussed, the signal must traverse the entire length of the signal path defining the bus, which often lead to relatively long signal path. Such long signal path lengths are undesirable since they introduce propagation delays into the signal path which can limit the processing speed of the computer system. Propagation delays can be a significant factor in the processing speeds which are obtainable in an electronic system. Additionally, signal transmission characteristics such as reflection, noise and cross-talk also are adversely effected by long signal lengths and considerable caution needs to be exercised in the design of systems employing bussed signal paths to avoid such problems. Such concerns and problems often result in increased cost dedicated to the elimination of such problems during the design of such systems and increased debugging time when problems are detected.

An additional drawback with systems using bussed backplane signal lines is the effect such a bus can experience from "hot swapping" of modules. Hot swapping refers to the ability to remove a module from a system or to insert a module into a system without powering down the system before such insertion or removal. In bussed backplane systems, hot swapping of modules can negatively effect other modules of the system. Since the bussed signal line is in common with the other modules connected to the bus, removing or adding a module to the bus while the system is powered on results in the bussed signal characteristics being changed, which in turn affects the signal being transported along the bussed signal line.

It would be desirable to provide a high speed interconnect between modules of a system that affords substantial improvements in signal speed while maintaining signal integrity with short interconnect transmission lines to ensure fast edge rates, and while permitting hot swapping of modules without impact on other modules which continue to operate within the system.

BRIEF SUMMARY OF THE INVENTION

A module interconnection system comprising a backplane having a plurality of connectors mounted thereon and selectively interconnected is disclosed. The presently disclosed interconnection system minimizes propagation delays between interconnected modules within the system by virtue of the physical arrangement of the respective connectors and modules within the system which permits short signal paths to be achieved.

The backplane which has a first set of connectors defining a first set of slots having a first orientation (horizontal) and a second set of connectors defining a second set of slots (vertical) at right angles to said first set of connectors. Selected signals on each of said first set of connectors are electrically coupled to respective ones of said second set of connectors employing point-to-point signalling. The second set of connectors are disposed adjacent to one of said first set of connectors to minimize the length of the signal paths between the first set of connectors and the second set of connectors.

In a preferred embodiment of the invention, at least one switch fabric of a network switch and at least one central control processor are disposed within said first set of connectors and a plurality of I/O modules are disposed within respective ones of said second set of connectors. By virtue of the presently disclosed connection technique, propagation delays between the switch fabric and the I/O modules are minimized. Point-to-point signalling between the switch fabrics and the respective I/O modules avoids the above described problems associated with bussed connection systems.

BRIEF DESCRIPTION OF THE SEVERAL VIEWS OF THE DRAWING

The invention will be more fully understood by reference to the following detailed description in conjunction with the accompanying drawings in which.

DETAILED DESCRIPTION OF THE INVENTION

Figure 1:
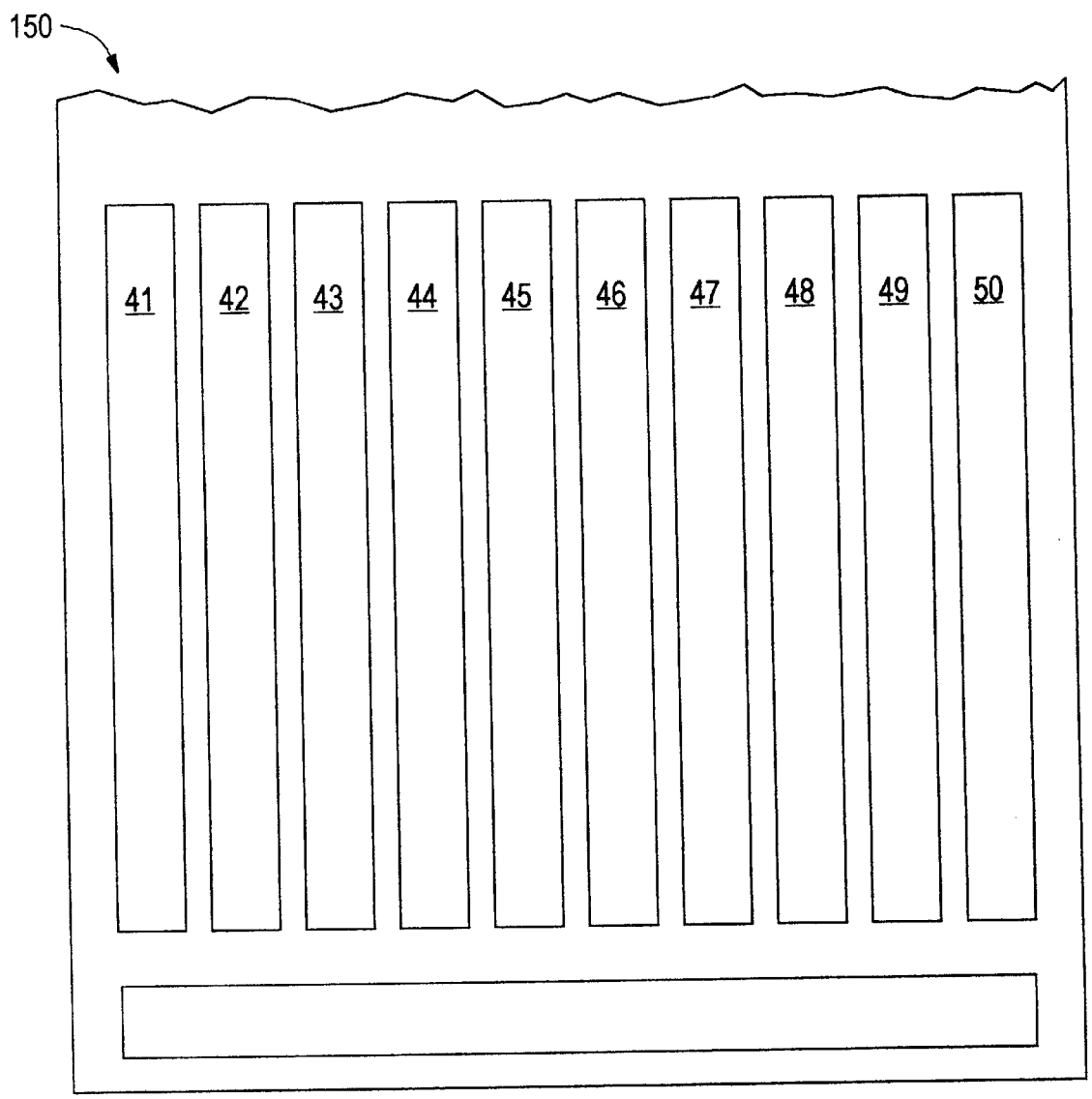
FIG. 1 is a diagram of a portion of a prior art module interconnection system.

Referring to FIG. 1 a prior art backplane interconnect system 150 is illustrated. This system has a plurality of connectors 41–50 for a first type of module, such as an Input Output (IO) module utilized within a computer network switch. The system 150 further includes a first and second connectors 32, 34 respectively for a second type of module such as a switch fabric module. All of the connectors 41–50 and 32–34 are disposed in parallel side by side as shown.

In use, the switch fabric module includes a plurality of high speed devices which must communicate with a high speed device on each of the IO modules. As depicted in FIG. 1, for a signal to traverse a path between the switch fabric module in connector 32 and the IO module in connector 41, the signal must travel along a physical path of considerable length.

This length adds propagation delay to the signal and may result in the undesirable introduction of noise to the signal as it propagates along the respective path.

Figure 2A:
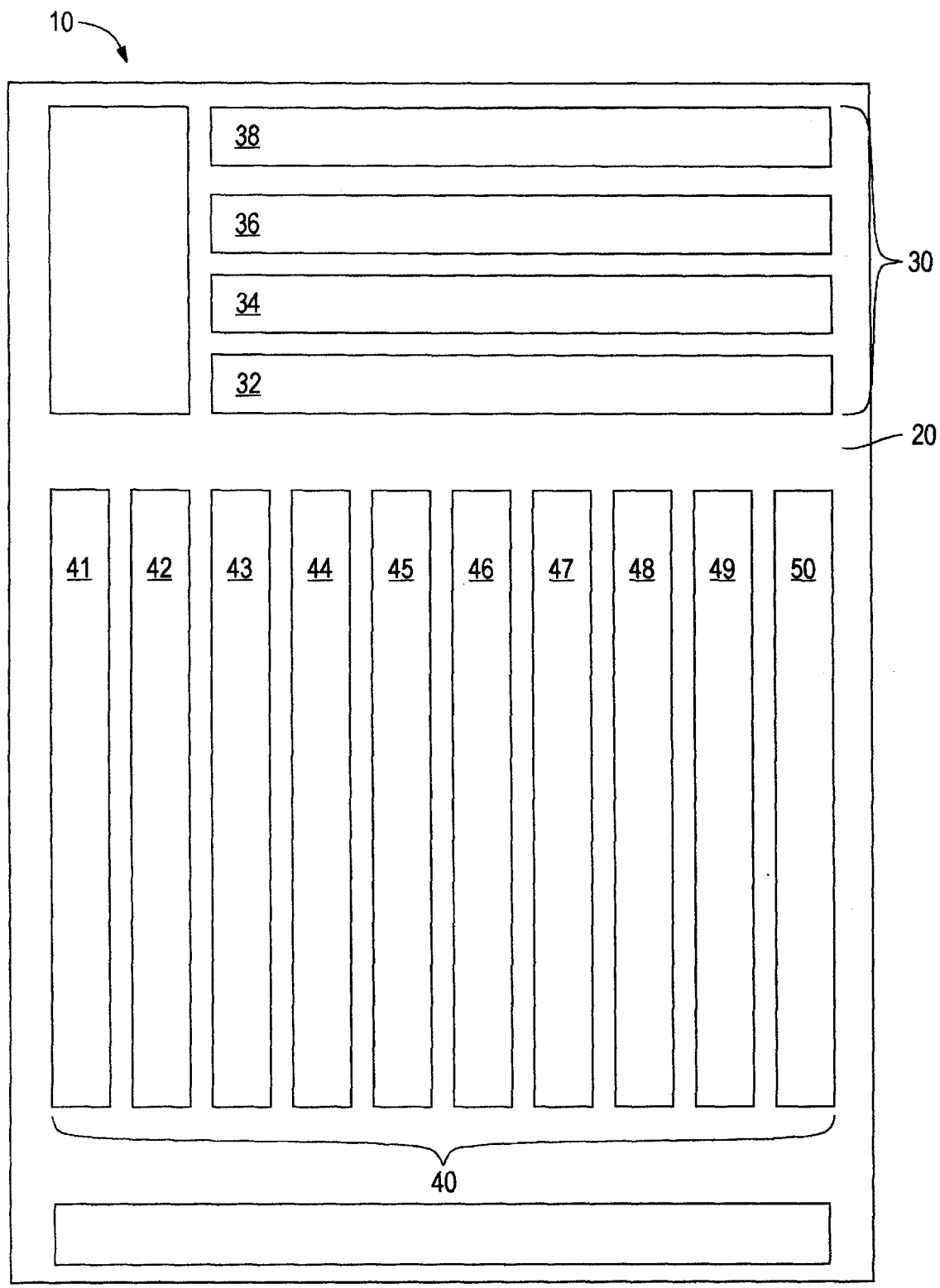
FIG. 2A is a diagram of the module interconnection system of the present invention.
Figure 2B:
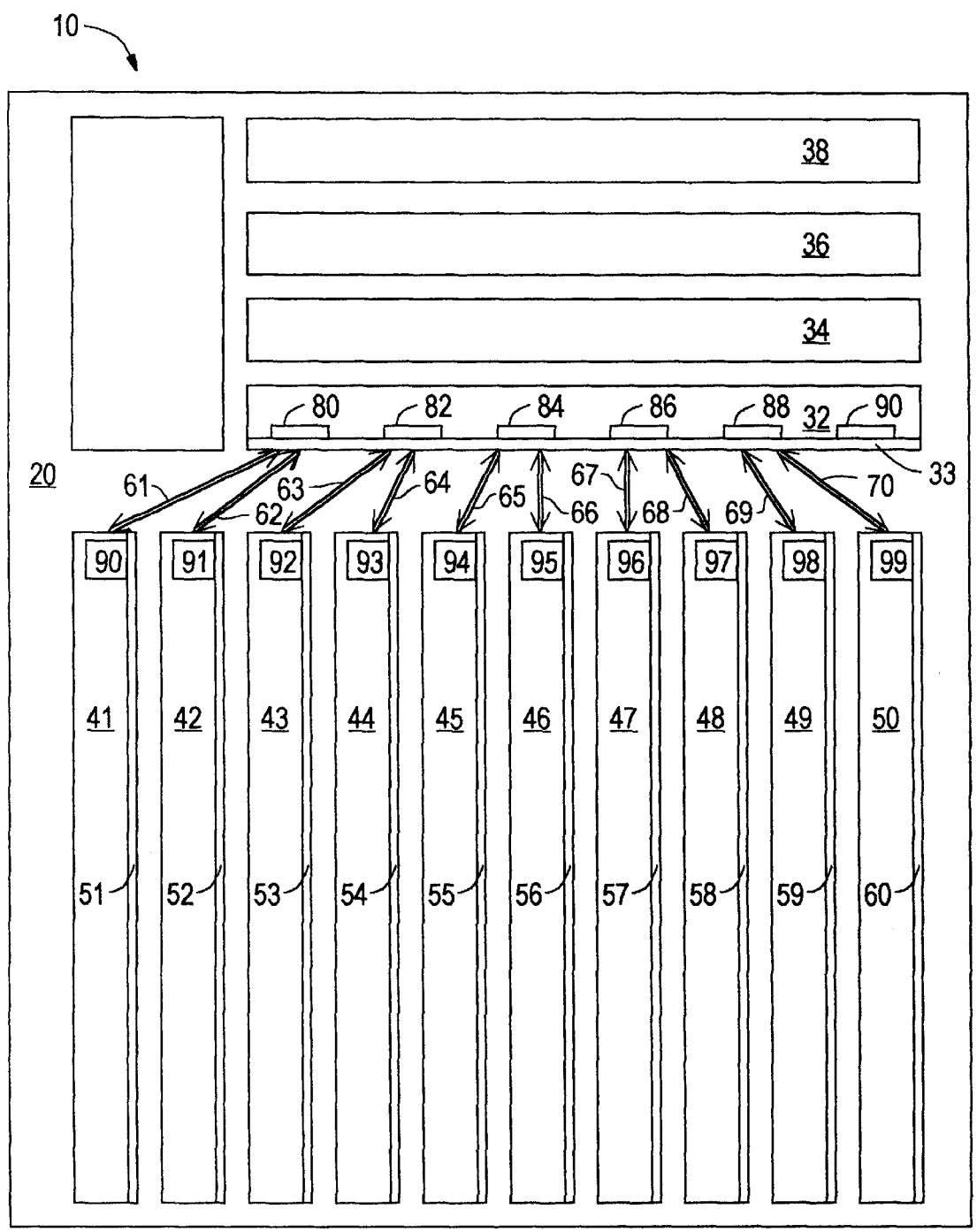
FIG. 2B is a diagram of the module interconnection system of FIG. 2A showing high speed signal flows between modules of the system.

An embodiment of the presently disclosed module interconnection system is depicted in FIGS. 2A and 2B. The system 10 comprises a backplane 20 which includes first plurality of generally horizontal connectors 30 and a second plurality of generally vertical connectors 40 arranged at right angles to the first plurality of connectors 30. While the connectors are referenced as being either horizontal or vertical, it should be appreciated that such references are intended solely for purposes of ease of description and the respective connectors may be arranged in any orientation so long as the relative positioning is maintained. While the first plurality of connectors 30 are shown as comprising four connectors 32, 34, 36, and 38 in this embodiment, it should be appreciated that any number of generally horizontal connectors may be employed. Additionally, while the second plurality of connectors 40 are shown as including ten connectors 41–50, it should be appreciated that any number of generally vertical connectors may be employed.

Each of the connectors is configured to accept a module having a mating connector on one edge thereof. Each module includes at least one connector disposed along a first edge of the respective module that provides interconnection to electronic devices disposed on the module. When a module connector is electrically coupled to a respective backplane connector, the module connector contacts mate with corresponding signal contacts of the backplane connector thereby providing electrical communication between the backplane signal lines and electronic devices on the module.

Figure 3:
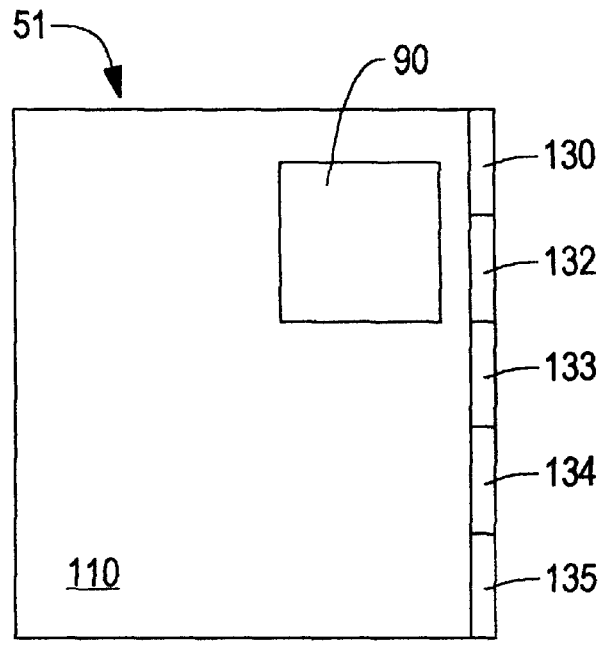
FIG. 3 is a block diagram of a first module utilized in the module interconnect system of the present invention.
Figure 4:
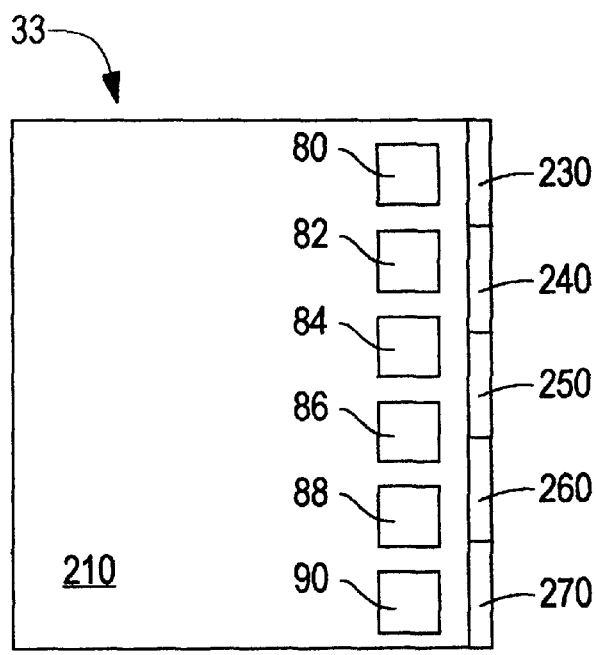
FIG. 4 is a block diagram of a second module utilized in the module interconnect system of the present invention.

Referring to FIGS. 2B, 3 and 4, the first horizontal connector 32 is shown containing a module 33, which in the present embodiment is a switch fabric module. The switch fabric module 33 contains five high speed integrated interface circuits 80, 82, 84, 86 and 88 which serve to provide a high speed electrical interface between the switch fabric 33 and respective IO modules 51, 52, 53, 54, 55, 56, 57, 58, 59 and 60 disposed in respective ones of the second plurality of connectors 40. While any suitable interface circuit may be employed, one interface circuit appropriate for electrically coupling a switch fabric module to IO modules is disclosed with particularity in U.S. application Ser. No. 08/921,908 titled APPARATUS AND METHOD FOR EFFICIENTLY TRANSFERRING ATM CELLS ACROSS A BACKPLANE IN A NETWORK SWITCH, filed on the same date as the present application, which application is incorporated herein by reference. More specifically, each interface circuit on the switch fabric 33 is electrically coupled to selected contacts of connector 32 and signal paths are further provided which couple the selected contacts of connector 32 associated with the respective high speed interface circuit to contacts of one of the connectors 41–50 which in turn are coupled to the respective IO modules disposed within the connector.

In the present embodiment the vertically oriented modules 51–60 comprise IO modules of a network switch as shown in FIG. 3. Each IO module 51–60 includes a high speed integrated interface circuit 90–99 respectively, which also requires use of a high speed interconnect in order to communicate with the appropriate high speed integrated interface circuit on the switch fabric module 33, shown in FIG. 4. As shown in FIG. 2B, integrated circuit 80 of switch fabric module 33 communicates with integrated circuit 90 of IO module 51 by way of a high speed interconnect 61.

Since the IO modules 51 and 52 and the respective connectors 41 and 42 are oriented perpendicular to the switch fabric module 33 and the associated connector(s) 32, the length of the interconnect signal paths 61 and 62 between the switch fabric module 33 and the IO modules 51 and 52 is minimized. Additionally, the length of the signal paths is minimized by mounting one end of the connectors 41 and 42 adjacent the switch fabric connector(s) 32. The length of the other interconnects between integrated circuit 82 on the switch fabric 33 and integrated circuits 92 and 93 on respective IO modules 53 and 54 as well as other interconnected are similarly minimized.

In addition signal flow from IO modules to a redundant switch fabric 34 in FIG. 2*b* is also supported with attendant minimization of line lengths and simplicity of interconnect.

Communication between the switch fabric modules and the Input Output modules in the presently disclosed apparatus occurs reliably at rates of at least 400 megabits per second (mb/s).

The backplane module 20 in this embodiment is a 24 layer double-sided module, fabricated using standard multilayer circuit board technology. While a 24 layer backplane module is described, other embodiments could include a backplane having any number of layers.

Point-to-point routing of signals is employed between the switch fabric 33 and the respective IO modules 51 and 52, and with the other IO modules to eliminate problems associated with high speed bussed signals as discussed hereinabove.

In a preferred embodiment of the invention, each signal line of the high speed interconnect is routed on only a single layer of the backplane module thereby eliminating vias, which are commonly used to connect a signal line on one layer of the backplane to a signal line on another layer of the backplane. The via decrease the reliability of the backplane and and capacitance to the respective signal line. Added capacitance is undesirable since increased capacitance makes it more difficult to drive the respective line at high speed.

The use of point-to-point signal lines instead of bussed signals spreads the routing of signal lines between the switch fabrics and respective IO modules across the backplane. Accordingly, even though point-to-point signal routing increases the total number of signal runs, areas of congestion are avoided, thus making the backplane easier to route, less complex to fabricate and thus lower in cost to produce since there is no need for complex termination networks or diodes along the signal lines.

The point-to-point signal lines are implemented as differential pairs. More specifically Low Voltage Differential Signals (LVDS) provide the signal transport characteristics required by the high speed interconnect of the backplane module 20. The signal lines are capable of transporting signals at a speed of up to approximately four hundred Megabits per second (Mb/s), and have a transition time of approximately 250 picoseconds. The longest point-to-point signal line has a length of approximately ten inches. Point-to-point signal lines are matched in length to within 0.025 inches where it is important to minimize skew between signals. The backplane skew within a group is less than 40 picoseconds using signal lines having a 5.5 mil etch width and an impedance of 55 ohms.

The layout of the backplane utilizing point-to-point signal lines requires many more signal lines than backplanes utilizing busses to provide the desired interconnect between modules of a system. However, the high speed interconnect of the present invention is more strictly controlled and permits tri-stating point-to-point signals to accommodate hot swapping of modules. Thus, in the presently disclosed system, since bussed interconnects are not employed, the removal of one board from the system does not affect signals involving other modules within the system. Accordingly, the present invention minimizes the maximum distance a signal transported on a signal line must propagate in order to travel from a first module in a first connector and a second module in a second connector. This reduction in signal propagation delay results from having the first module type connector oriented generally perpendicular to the second module type connector, utilizing point-to-point interconnect from the first module type connector to the second module type connector, having the signal line routed on a single layer of the backplane so as to avoid the use of vias, and having the length of the signal lines matched for selected signals when skew reduction is important.

In a system in which a second switch fabric is employed for purposes of redundancy, the second switch fabric may be inserted in connector 34 which includes a similar high speed point-to-point interconnect to the respective backplane connectors 41–50 as discussed above in connection with switch fabric 33. Only one of the switch fabrics is active at any one time to drive the associated interconnects.

In one application of the presently disclosed interconnection system, one or two central control processor 25 modules are coupled to connectors 36 and 38 respectively. The central control processors serve to configure the switch fabrics coupled to connectors 32 and/or 34, timing modules (not shown) and other central network switch functions as described with particularity in U.S. application Ser. No. 08/919,828 titled CONTROL PROCESSOR SWITCHOVER FOR A TELECOMMUNICATIONS SWITCH, filed on the same date as the present application, which application is incorporated herein by reference. Two central control processors may be disposed within two rows of said first plurality of rows of connectors for purposes of redundancy. When two central control processors are employed, one of the central control processors is in an active mode and is employed to configure the switch fabrics and the other of said central control processors is in an inactive mode at any given time.

Having described a preferred embodiment of the invention it should be apparent to those of ordinary skill in the art that other embodiments and variations of the presently disclosed embodiment incorporating these concepts may be implemented without departing from the inventive concepts herein disclosed. Accordingly, the invention should not be viewed as limited to the described embodiment but rather should be limited solely by the scope and spirit of the appended claims.

We claim:

1. A module interconnect for minimizing electronic signal propagation delay comprising:

a backplane having a first side and a second side;

a first plurality of connector rows, each row containing at least one connector mounted on said backplane in a generally parallel side by side relation with at least one connector of another one of said first plurality of rows, each connector within said first plurality of rows having a plurality of contacts, said connectors within said first plurality of rows mounted within a first area of said backplane;

a second plurality of connector rows, each row containing at least one connector mounted on said backplane in a generally parallel side by side relation with at least one connector of another one of said second plurality of rows, each connector within said second plurality of rows having a plurality of contacts, said connectors within said second plurality of rows mounted within a second area of said backplane, each one of said second plurality of connector rows containing a first connector having a first connector end disposed adjacent to at least one connector within one of said first plurality of connector rows, said second plurality of rows disposed non-parallel with respect to said first plurality of rows, and wherein said first area of said backplane does not overlap said second area of said backplane on either side of said backplane; and a plurality of signal lines for carrying digital information signals comprising at least first and second voltage levels, each of said plurality of signal lines interconnecting at least one contact of a connector within one of said first plurality of connector rows with a contact of a connector in each of only a subset of said second plurality of connectors.

2. The module interconnect of claim 1 wherein each one of said second plurality of connector rows is generally perpendicular to said first plurality of connector rows.

3. The module interconnect of claim 1 wherein at least some of said signal lines are routed on a single layer of said backplane.

4. The module interconnect of claim 1 wherein said first plurality of connector rows comprises at least two connector rows.

5. The module interconnect of claim 1 wherein said second plurality of connector rows comprises ten connector rows.

6. The module interconnect of claim 1 wherein said signal lines have a maximum length of less than approximately twenty inches.

7. The module interconnect of claim 1 wherein said signal lines have a maximum length of approximately ten inches.

8. The module interconnect of claim 1 wherein at least some of said signal lines comprise differential signal lines.

9. The module interconnect of claim 1 wherein at least some of said signal lines comprise low voltage differential signalling lines.

10. The module interconnect of claim 1 wherein at least some of said signal lines have a length within 0.025 inches of another one of said lines.

11. Network switch interconnect apparatus comprising:

a backplane having a first side and a second side;

a first plurality of connector rows, each row containing at least one connector mounted on said backplane in a generally parallel side by side relation with at least one connector of another one of said first plurality of rows, each connector within said first plurality of rows having a plurality of contacts, said connectors within said first plurality of rows mounted within a first area of said backplane;

at least one switch fabric module having a plurality of input and a plurality of outputs, said switch fabric having a plurality of electrical contacts, said electrical contacts of said switch fabric electrically coupling said inputs and outputs of said at least one switch fabric module to selected ones of said contacts of connectors within said selected one of said first plurality of connector rows;

a second plurality of connector rows, each row containing at least one connector mounted on said backplane in a generally parallel side by side relation with at least one connector of another one of said second plurality of rows, each connector within said second plurality of rows having a plurality of contacts, said connectors within said second plurality of rows mounted within a second area of said backplane, each one of said second plurality of connector rows containing a first connector having a first connector end disposed adjacent to at least one connector within one of said first plurality of connector rows, said second plurality of rows disposed non-parallel with respect to said first plurality of rows, and wherein said first area of said backplane does not overlap said second area of said backplane on either side of said backplane;

at least one Input Output Module having a plurality of electrical contacts, said at least one Input Output Module electrical contacts being coupled to selected ones of said contacts of connectors within a selected one of said plurality of connectors within a selected row of said second plurality of connector rows, said at least one Input Output Module having a plurality of input ports and a plurality of output ports and being operative to receive data units at said input ports of said Input Output Module and to transmit data units to respective communication links from said output ports of said Input Output Module; and a plurality of signal lines for carrying digital information signals comprising at least first and second voltage levels, each of said plurality of signal lines interconnecting at least one contact of a connector within one of said first plurality of connector rows with a contact of a connector in each of only a subset of said second plurality of connectors;

said switch fabric being operative to receive data units over at least one of said plurality of signal lines at selected ones of said plurality of inputs from said at least one Input Output Module and to forward said data units from said switch fabric through at least one of said plurality of outputs to said at least one Input Output Module over at least one said plurality of signal lines for transmission over the respective communication link.

12. The network switch apparatus of claim 11 wherein said at least one switch fabric module comprise first and second switch fabric modules, said first and second switch fabric modules each being electrically coupled to respective first and second connectors in first and second rows of said first plurality of connector rows.

13. The network switch apparatus of claim 11 further comprising:

a central control processor disposed in electrical communication with connectors in a third row of said first plurality of connector rows, said central control processor being in electrical communication with said at least one switch fabric and operative to configure said at least one switch fabric.

14. The network switch apparatus of claim 12 further comprising:

first and second central control processors disposed in third and fourth rows of said first plurality of rows of connectors, each of said central control processor being in electrical communication with said at least one switch fabric and operative to configure said at least one switch fabric, wherein one of said central control processors is in an active mode and the other one of said central control processors is in an inactive mode at any given time.

* * * * *

UNITED STATES PATENT AND TRADEMARK OFFICE
CERTIFICATE OF CORRECTION

PATENT NO      : 6,015,300
DATED          : January 18, 2000
INVENTOR(S)    : Raymond J. Schmidt, Jr., et al.

It is certified that error appears in the above-identified patent and that said Letters Patent are hereby corrected as shown below:

Column 5, line 23, "processor 25 modules", should read --processor modules--.

Signed and Sealed this

Eighth Day of May, 2001

Attest:

NICHOLAS P. GODICI

Attesting Officer    Acting Director of the United States Patent and Trademark Office